(12) United States Patent
Tapily et al.

(10) Patent No.: US 9,882,026 B2
(45) Date of Patent: Jan. 30, 2018

(54) METHOD FOR FORMING A NANOWIRE STRUCTURE

(71) Applicant: Tokyo Electron Limited, Tokyo (JP)

(72) Inventors: Kandabara N. Tapily, Albany, NY (US); Genji Nakamura, Kai (JP)

(73) Assignee: Tokyo Electron Limited, Tokyo (JP)

( * ) Notice: Subject to any disclaimer, the term of this patent is extended or adjusted under 35 U.S.C. 154(b) by 47 days.

(21) Appl. No.: 14/993,935

(22) Filed: Jan. 12, 2016

(65) Prior Publication Data

US 2016/0204228 A1 Jul. 14, 2016

Related U.S. Application Data

(60) Provisional application No. 62/102,735, filed on Jan. 13, 2015.

(51) Int. Cl.
*H01L 21/00* (2006.01)
*H01L 21/84* (2006.01)
*H01L 29/66* (2006.01)
*H01L 29/06* (2006.01)
*H01L 29/423* (2006.01)
*H01L 29/786* (2006.01)

(52) U.S. Cl.
CPC .... *H01L 29/66772* (2013.01); *H01L 29/0673* (2013.01); *H01L 29/42392* (2013.01); *H01L 29/78618* (2013.01); *H01L 29/78654* (2013.01); *H01L 29/78696* (2013.01)

(58) Field of Classification Search
None
See application file for complete search history.

(56) References Cited

U.S. PATENT DOCUMENTS

| 9,029,835 | B2 * | 5/2015 | Chu-King | H01L 29/267 257/24 |
| 9,741,810 | B2 * | 8/2017 | Ching | H01L 29/42392 |
| 2006/0216897 | A1 | 9/2006 | Lee et al. | |
| 2010/0295024 | A1 | 11/2010 | Pernel et al. | |
| 2012/0129354 | A1 | 5/2012 | Luong | |
| 2012/0138886 | A1 | 6/2012 | Kuhn et al. | |
| 2013/0313513 | A1 | 11/2013 | Cappellani et al. | |

(Continued)

OTHER PUBLICATIONS

Combined Taiwanese Office Action and Search Report dated Dec. 30, 2016 in Patent Application No. 105100753 (with English language translation).

*Primary Examiner* — Telly Green
(74) *Attorney, Agent, or Firm* — Oblon, McClelland, Maier & Neustadt, L.L.P.

(57) ABSTRACT

Embodiments of the invention describe a method for forming a nanowire structure on a substrate. According to one embodiment, the method includes a) depositing a first semiconductor layer on the substrate, b) etching the first semiconductor layer to form a patterned first semiconductor layer, c) forming a dielectric layer across the patterned first semiconductor layer, and d) depositing a second semiconductor layer on the patterned first semiconductor layer and on the dielectric layer. The method further includes e) repeating a)-d) at least once, f) following e), repeating a)-c) once, g) etching the patterned first semiconductor layers, the dielectric layers, and the second semiconductor layers to form a fin structure, and h) removing the patterned first semiconductor layers from the fin structure.

20 Claims, 10 Drawing Sheets

(56) References Cited

U.S. PATENT DOCUMENTS

| | | |
|---|---|---|
| 2013/0320294 A1 | 12/2013 | Cappellani et al. |
| 2014/0001441 A1 | 1/2014 | Kim et al. |
| 2015/0069328 A1* | 3/2015 | Leobandung ......... H01L 29/775 257/24 |
| 2015/0364603 A1* | 12/2015 | Cheng ................. H01L 29/7851 257/192 |
| 2016/0035849 A1* | 2/2016 | Ching ............... H01L 29/42392 257/27 |
| 2016/0225916 A1* | 8/2016 | Leobandung ......... H01L 29/775 |

* cited by examiner

METHOD FOR FORMING A NANOWIRE STRUCTURE

CROSS-REFERENCE TO RELATED APPLICATIONS

This application is related to and claims priority to U.S. Provisional Application No. 62/102,735, filed Jan. 13, 2015, the entire contents of which are herein incorporated by reference.

FIELD OF THE INVENTION

The present invention generally relates to a method for forming a semiconductor device, and more particularly to a method of forming a nanowire structure on a substrate.

BACKGROUND OF THE INVENTION

The semiconductor industry has relied on scaling/reducing device feature size in order to boost performance and increase transistor density. The continued device performance improvement due to scaling has seen the introduction of unique technologies such as semiconductor on insulator (e.g., SOI and GeO), stressor such SiGe, SiC, to improve mobility at the 90 nm node, epitaxial regrowth of source and drain (raised source and drain), high-k metal gate (HKMG) at the 45 nm node, and 3D structures such as FinFETs and trigates at the 22 nm node.

However, maintaining the device performance and good short channel control is quite challenging beyond the 14 nm technology node. New materials (e.g., III-V semiconductors, Ge, SiGe, graphene, $MoS_2$, $WS_2$, $MoSe_2$, and $WS_2$) and new integration schemes (e.g., nanowires) are needed. Nanowires offer scaling of feature size, good short channel control, and enhancement in the device electron mobility, hence enhancement in device speed.

SUMMARY OF THE INVENTION

Embodiments of the invention describe a method for forming a nanowire structure on a substrate.

According to one embodiment, the method includes a) depositing a first semiconductor layer on the substrate, b) etching the first semiconductor layer to form a patterned first semiconductor layer, c) forming a dielectric layer across the patterned first semiconductor layer, and d) depositing a second semiconductor layer on the patterned first semiconductor layer and on the dielectric layer. The method further includes e) repeating a)-d) at least once, f) following e), repeating a)-c) once, g) etching the patterned first semiconductor layers, the dielectric layers, and the second semiconductor layers to form a fin structure, and h) removing the patterned first semiconductor layers from the fin structure.

DETAILED DESCRIPTION OF SEVERAL EMBODIMENTS

This disclosure describes fabrication of a nanowire structure and integration of the nanowire structure into a semiconductor device.

Figure 1:
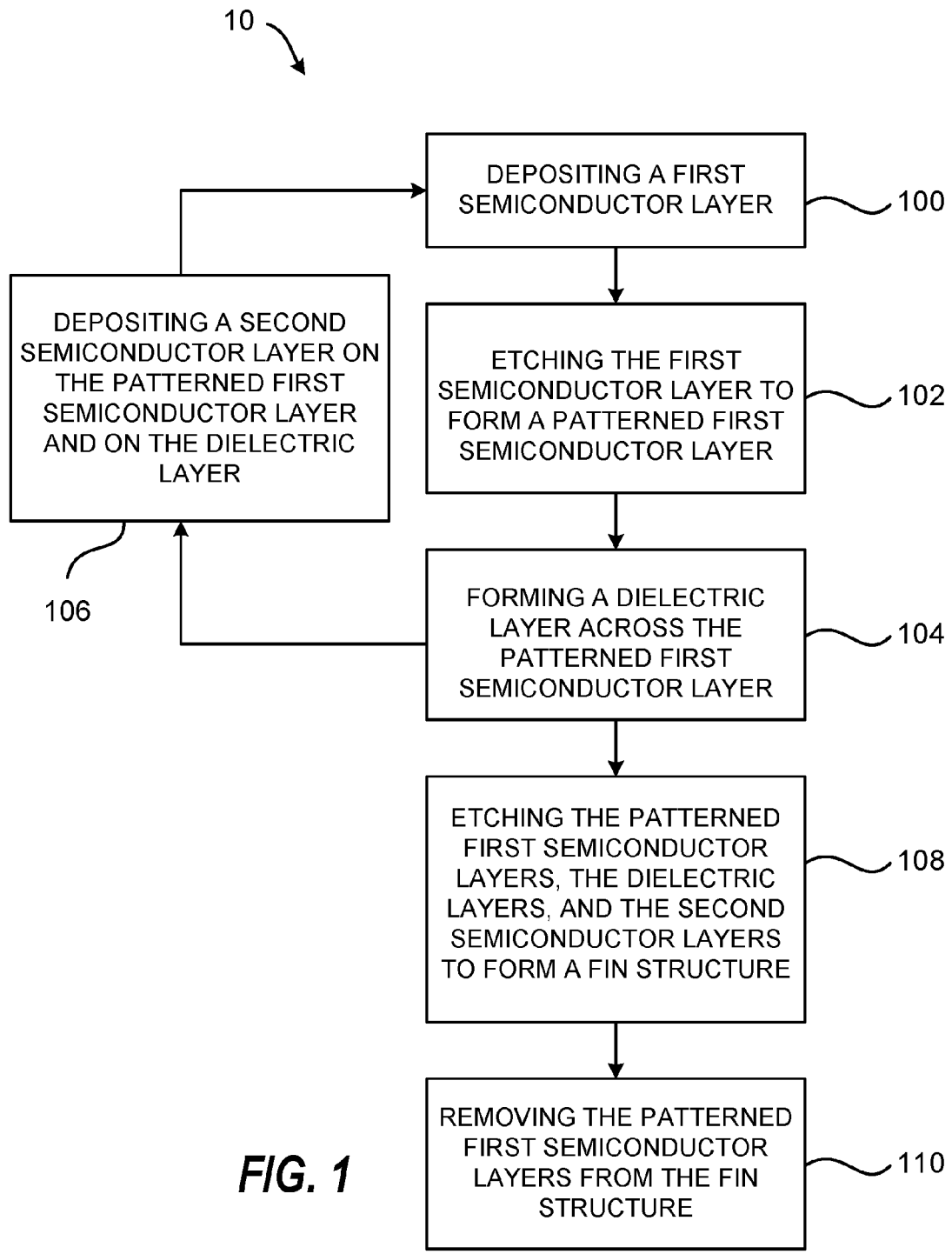
FIG. 1 shows a process flow for forming a nanowire structure on a substrate.

Referring now to the figures, FIG. 1 shows a process flow for forming a nanowire structure on a substrate, and FIGS. 2A-2M schematically show through schematic cross-sectional views a process flow for forming a semiconductor nanowire structure on a substrate. Although only shown 2-dimensionally in the figures, the nanowire structure is a 3-dimensional structure containing multiple vertically stacked nanowires having a length, a width, and a thickness. The process flow 10 includes, in step 100, depositing a first semiconductor layer 202 on a substrate 200 to form a structure 20. The substrate (e.g., a Si wafer) 100 can be of any size, for example a 200 mm wafer, a 300 mm wafer, a 450 mm wafer, or an even larger wafer. According to one embodiment, the substrate 200 and the first semiconductor layer 202 may selected from Si, $Si_xGe_{1-x}$, Ge, and compound semiconductors (e.g., III-V semiconductors). According to one embodiment, the first semiconductor layer 202 may be an epitaxially grown semiconductor layer. According to another embodiment, the substrate 200 may contain Ge or $Si_xGe_{1-x}$ compounds, where x is the atomic fraction of Si, and 1-x is the atomic fraction of Ge. In one example, the substrate 200 can contain a compressive-strained Ge layer or a tensile-strained $Si_xGe_{1-x}$ (x>0.5) deposited on a relaxed $Si_{0.5}Ge_{0.5}$ buffer layer.

Figure 2A:
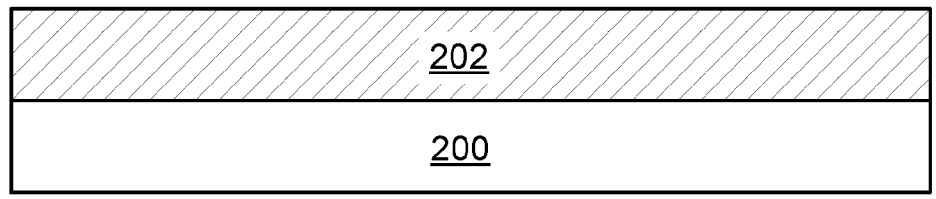
FIGS. 2A-2M schematically show through schematic cross-sectional views a process flow for forming a nanowire structure on a substrate.
Figure 2B:
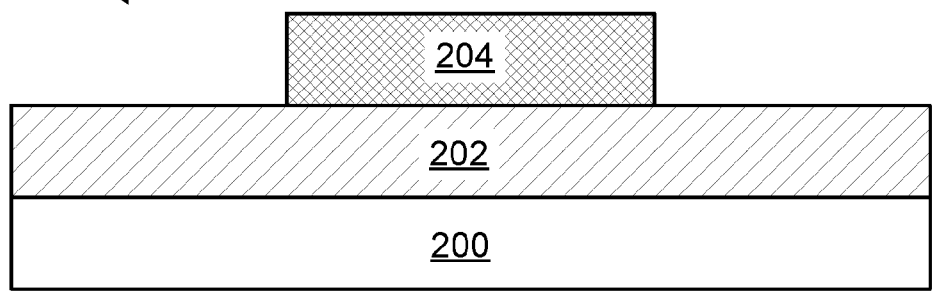
Figure 2C:
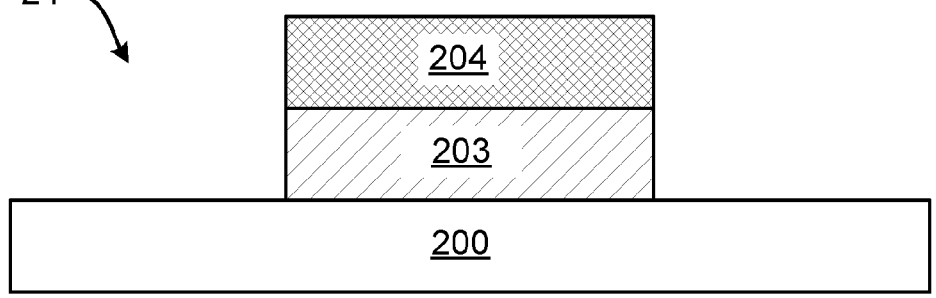

Referring also to structures 22 and 24 in FIGS. 2B and 2C, respectively, in step 102, the method includes etching the first semiconductor layer 202 to form a patterned first semiconductor layer 203. The etching may be carried out using a patterned film 204 as a mask on the first semiconductor layer 202 to etch the first semiconductor layer 202. The etching is selective and stops on the substrate 200. The patterned film 204 may contain a photoresist film, a hard mask layer, or a combination thereof, and it may be prepared using standard lithography and etching methods.

Figure 2D:
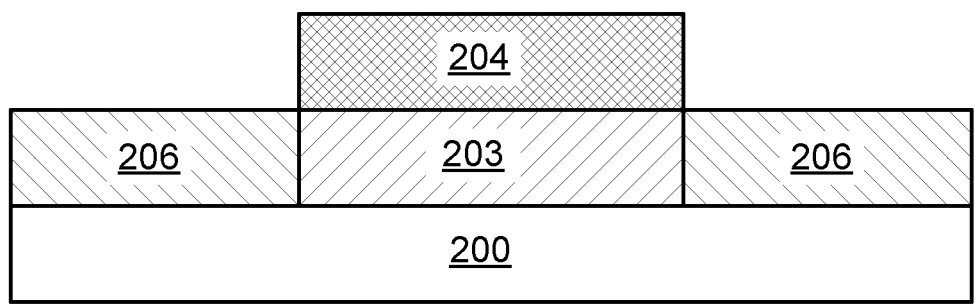

The method further includes, in step 104, forming a dielectric layer 206 across the patterned first semiconductor layer 203 (structure 26 in FIG. 2D). In one example, the dielectric layer 206 may be an epitaxial oxide layer that is selectively grown on the substrate 200 and not on the patterned film 204. An epitaxial oxide layer that is a crystalline overlayer may be grown using molecular beam epitaxy (MBE) or metal oxide chemical vapor deposition (MOCVD), for example. Non-limiting examples of an epitaxial oxide include $SiO_2$ and metal oxides such as $Gd_2O_3$, $CeO_2$, and $La_2O_3$. In another example, the dielectric layer 206 may be epitaxially deposited on the substrate 200, non-epitaxially deposited on the patterned film 204 and, thereafter, preferentially removing the non-epitaxial portion from the patterned film 204. The preferential removal may utilize the faster etching of non-epitaxial portion compared to the epitaxial portion. Thereafter, the patterned film 204 may be removed from the patterned first semiconductor layer 203 by dry or wet etching.

Figure 2E:
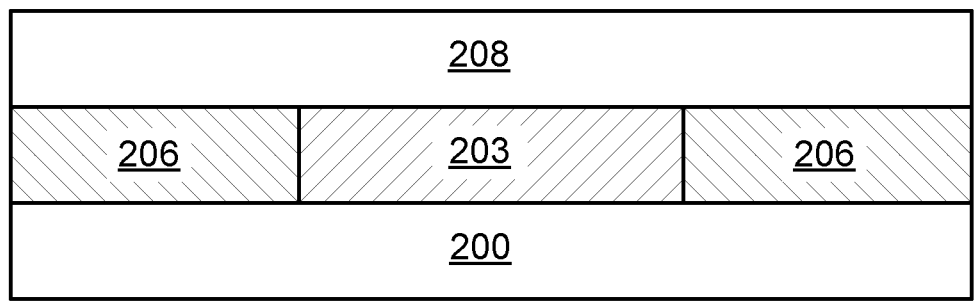

In step 106, a second semiconductor layer 208 is deposited on the patterned first semiconductor layer 203 and on the dielectric layer 206 to form structure 26 in FIG. 2E. The second semiconductor layer 208 has a different chemical composition than the patterned first semiconductor layer 203, and may be selected from Si, SiGe, Ge, and compound semiconductors (e.g., III-V semiconductors). According to one embodiment, the second semiconductor layer 208 may be an epitaxial semiconductor layer. According to one embodiment, the patterned first semiconductor layer 203 can contain epitaxial silicon and the second semiconductor layer 208 can contain epitaxial silicon germanium. According to another embodiment, the patterned first semiconductor layer 203 can contain epitaxial silicon germanium and the second semiconductor layer 208 can contain epitaxial silicon.

Figure 2F:
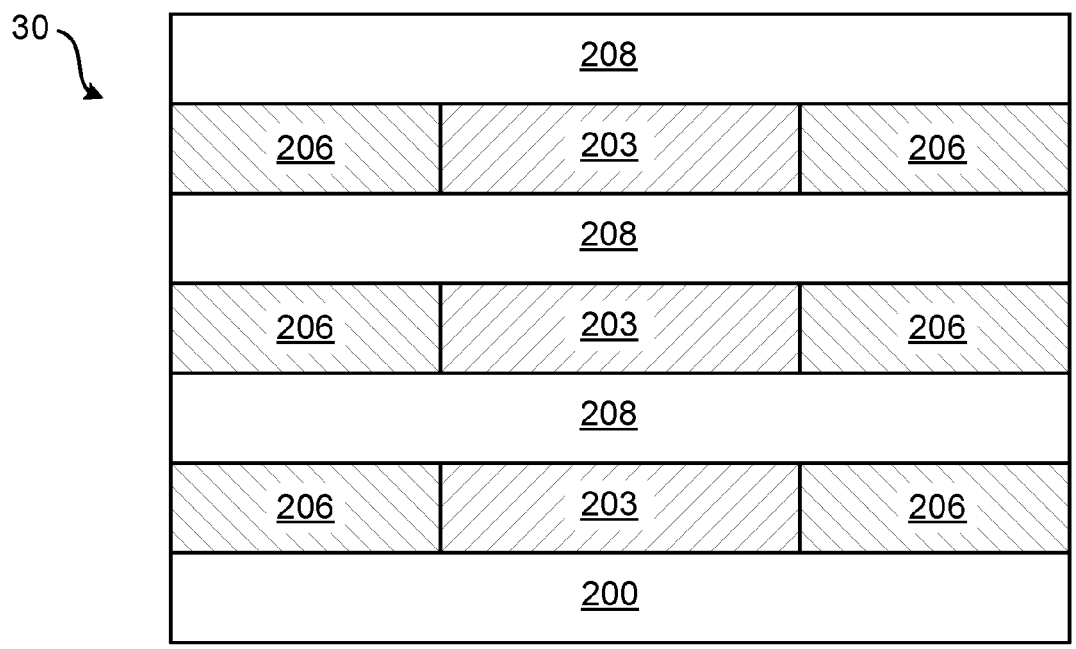
Figure 2G:
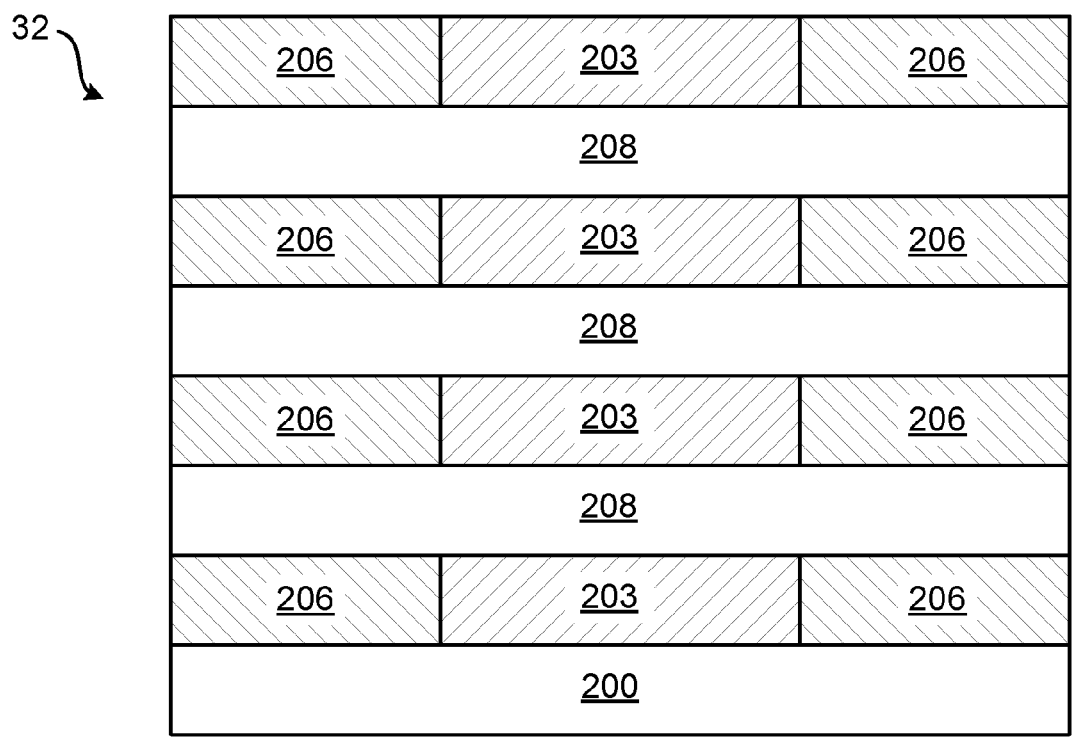
Figure 2H:
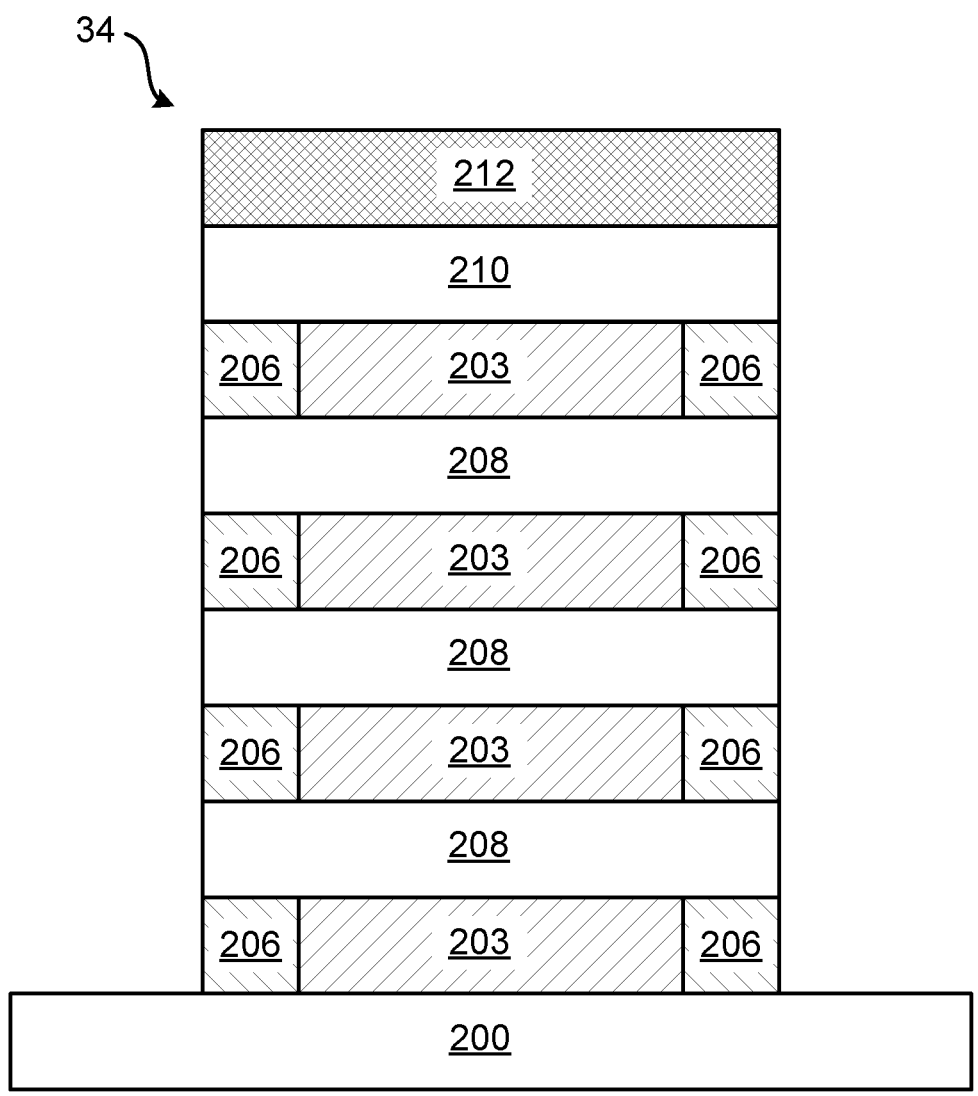

The processing steps 100-106 may be repeated at least once to form additional alternating layers of the patterned first semiconductor layer 203, the dielectric layer 206, and the second semiconductor layer 208. FIG. 2F shows a resulting structure 30 after repeating steps 100-106 twice, but other examples may contain fewer or additional alternating layers. Thereafter, steps 100-104 are carried out once before proceeding to step 108. The resulting structure 32 is shown in FIG. 2G.

In step 108, the process flow 10 further includes etching the plurality of patterned first semiconductor layers 203, dielectric layers 206, and second semiconductor layers 208. The etching can include forming a dummy gate 210 (e.g., poly silicon) and a mask layer 212 (e.g., SiN or $SiO_2$ or $SiO_2$ on SiN) on the dummy gate 210. The mask layer 212 can be used to etch the patterned first semiconductor layers 203, the dielectric layers 206, the second semiconductor layers 208, and the dummy gate 210 to form the fin structure 34 schematically shown in FIG. 2H.

Figure 2I:
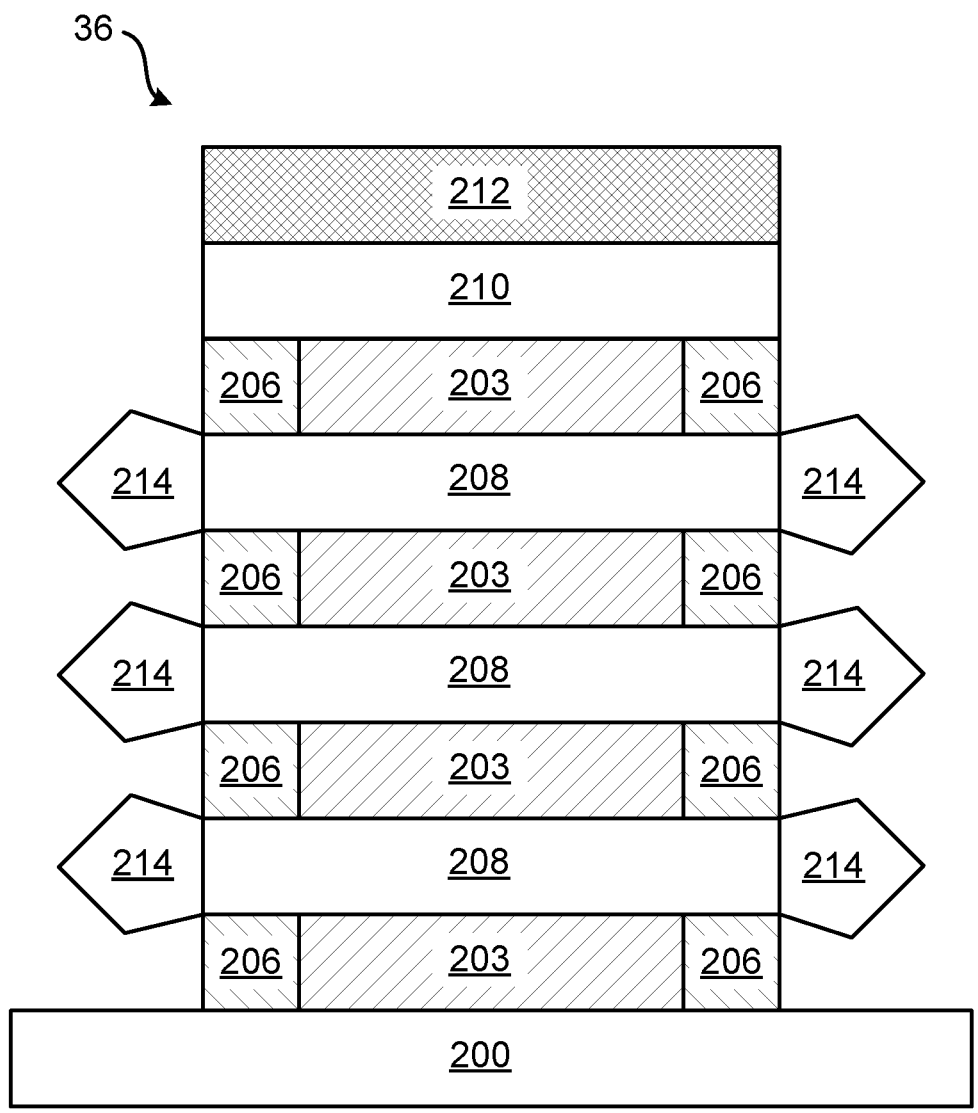

Thereafter, as depicted in FIG. 2I, source and drains 214 can be selectively and epitaxially grown on the second semiconductor layers 208. The source and drains 214 can contain or consist of the same material as the second semiconductor layer 208. Thereafter, a dielectric material 216 (e.g., $SiO_2$ or SiN) may be deposited over the structure 36 in FIG. 2I and the dielectric material 216 planarized using chemical mechanical polishing (CMP). The planarizing process removes the mask layer 212 on the dummy gate 210. The resulting structure 38 is shown in FIG. 2J.

Figure 2J:
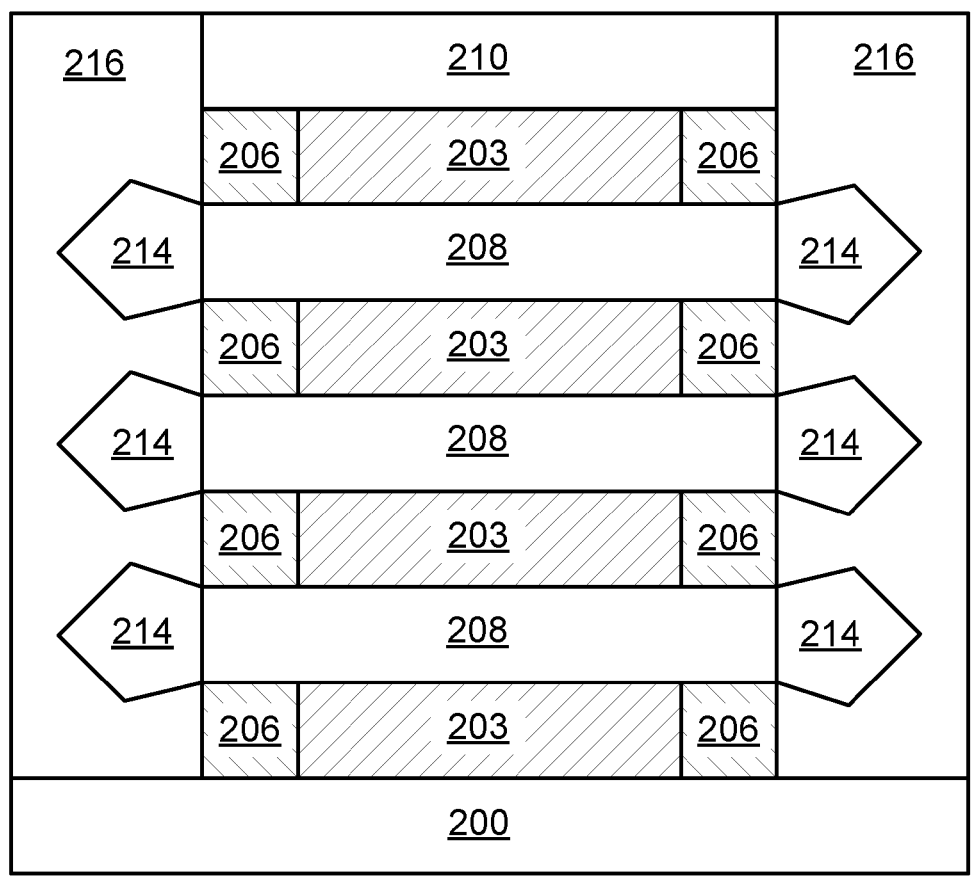
Figure 2K:
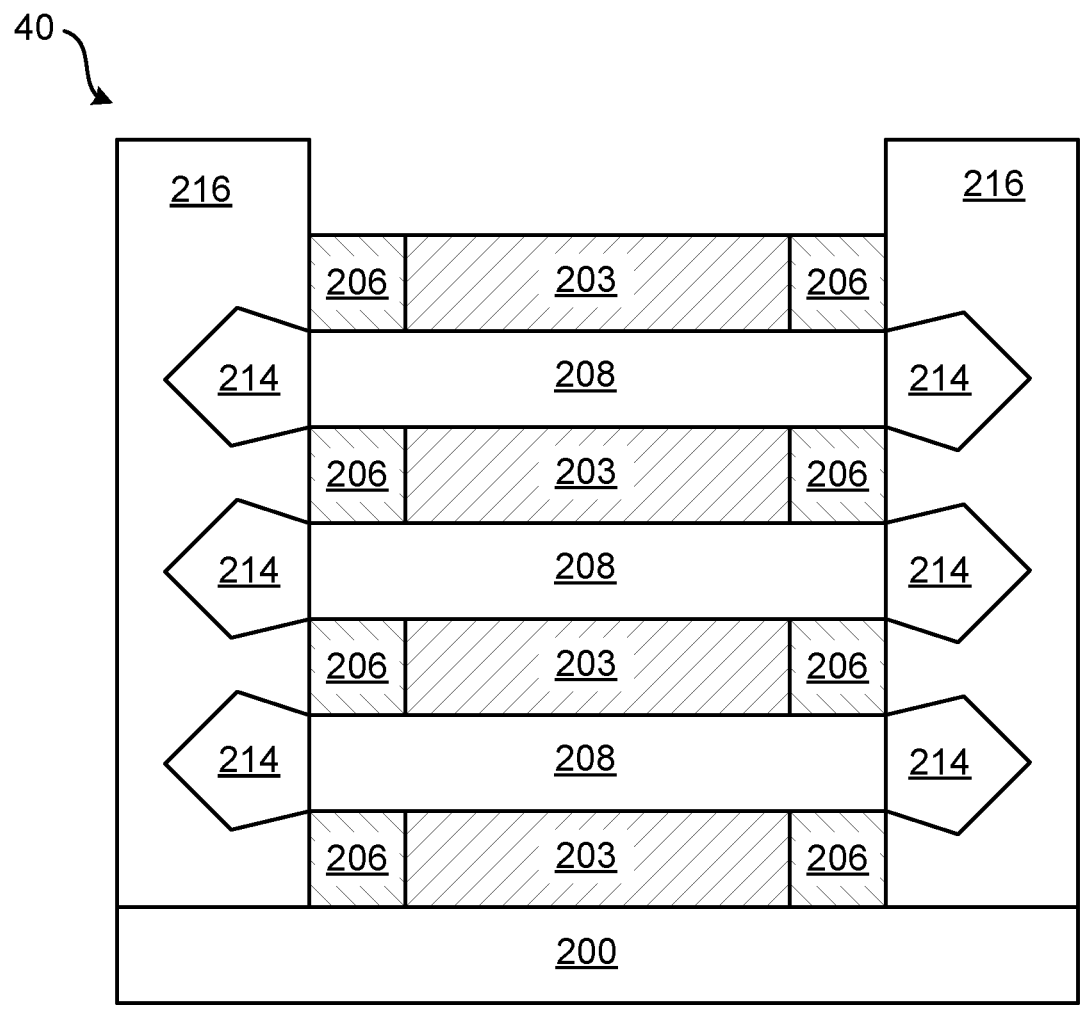
Figure 2L:
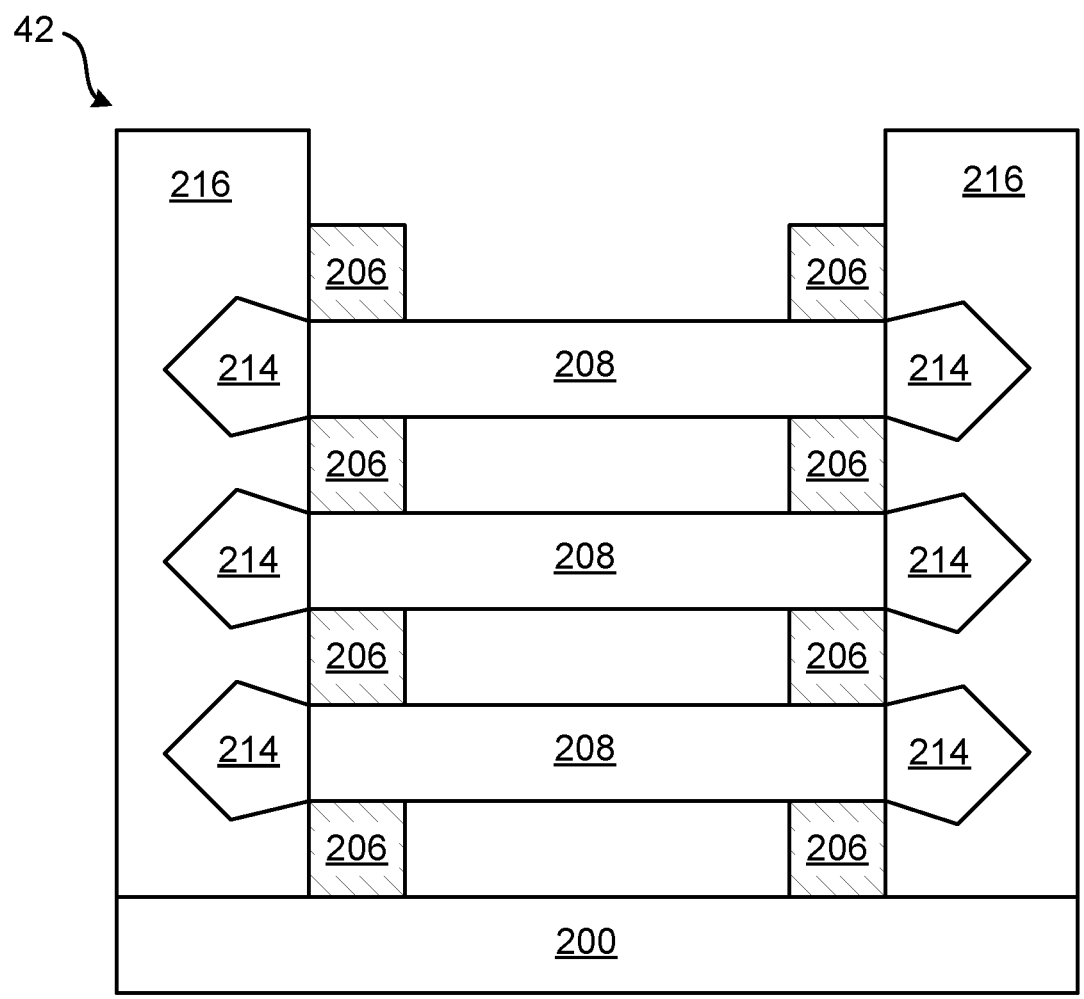

Thereafter, the fin structure 38 in FIG. 2J may be further processed to form a nanowire structure. The further processing can include, removing the dummy gate 210 in a first selective etch process, shown as structure 40 in FIG. 2K, and in 110, removing the patterned first semiconductor layer 203 from the structure 40 in a second selective etch process. FIG. 2L shows the resulting structure 42 containing vertically stacked nanowires containing the second semiconductor layers 208.

Figure 2M:
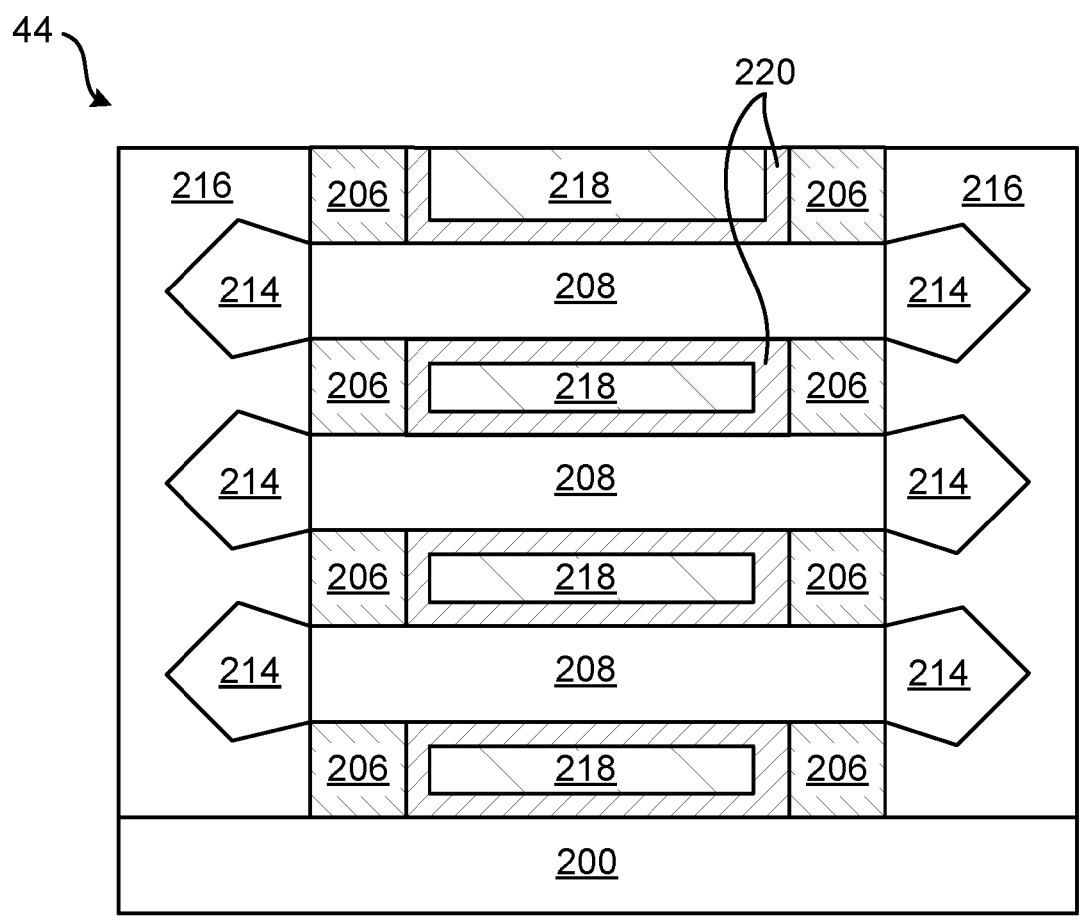

The nanowire structure in FIG. 2L may be further processed by continuing conventional high-k/metal gate processing. The further processing can include forming a gate dielectric layer 220 around the nanowires of the second semiconductor layers 208, and forming a gate electrode material 218 around the gate dielectric layer 220. FIG. 2M shows the resulting nanowire structure 44.

A method for forming a nanowire structure on a substrate has been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a nanowire structure on a substrate, the method comprising:
   a) depositing a first semiconductor layer on the substrate;
   b) etching the first semiconductor layer to form a patterned first semiconductor layer;
   c) forming a dielectric layer adjacent to the patterned first semiconductor layer;
   d) depositing a second semiconductor layer on the patterned first semiconductor layer and on the dielectric layer after forming the dielectric layer;
   e) repeating a)-d) at least once;
   f) following e), repeating a)-c) once;
   g) etching the patterned first semiconductor layers, the dielectric layers, and the second semiconductor layers to form a fin structure; and
   h) removing the patterned first semiconductor layers from the fin structure.

2. The method of claim 1, wherein removing the patterned first semiconductor layers forms nanowires of the second semiconductor layers that are separated from each other by a gap.

3. The method of claim 2, further comprising forming a gate dielectric layer around the nanowires.

4. The method of claim 3, further comprising forming a gate electrode layer around the gate dielectric layer.

5. The method of claim 1, wherein the first and second semiconductor layers are epitaxial layers.

6. The method of claim 1, wherein the material of the patterned first semiconductor layers and the material of the second semiconductor layers are different and are selected from the group consisting of Si, SiGe, Ge, and compound semiconductors.

7. The method of claim 1, wherein the patterned first semiconductor layers contain epitaxial silicon and the second semiconductor layers contain epitaxial silicon germanium.

8. The method of claim 1, wherein the patterned first semiconductor layers contain epitaxial silicon germanium and the second semiconductor layers contain epitaxial silicon.

9. The method of claim 1, wherein b) includes
   forming a patterned film on the first semiconductor layer; and
   etching the first semiconductor layer according to the patterned film.

10. The method of claim 9, wherein c) includes
    selectively growing the dielectric layer as an epitaxial layer on the substrate but not on the patterned film.

11. The method of claim 9, wherein c) includes
    growing the dielectric layer as an epitaxial layer on the substrate and as a non-epitaxial layer on the patterned film; and
    removing the non-epitaxial layer from the patterned film.

12. The method of claim 1, wherein the dielectric layer includes an epitaxial oxide.

13. The method of claim 12, wherein the epitaxial oxide is selected from the group consisting of $SiO_2$ and a metal oxide.

14. The method of claim 13, wherein the metal oxide is selected from the group consisting of $Gd_2O_3$, $CeO_2$, and $La_2O_3$.

15. A method of forming a nanowire structure on a substrate, the method comprising:
    a) depositing a SiGe layer on the substrate;
    b) etching the SiGe layer to form a patterned SiGe layer;
    c) forming an oxide layer adjacent to the patterned SiGe layer;
    d) depositing a Si layer on the patterned SiGe layer and on the oxide layer after forming the oxide layer;
    e) repeating a)-d) at least once;

following e), repeating a)-c) once;

g) etching the patterned SiGe layers, the oxide layers, and the Si layers to form a fin structure; and h) removing the patterned SiGe layers from the fin structure, wherein the patterned SiGe layers are removed from the fin structure to form Si nanowires that are separated from each other by a gap.

16. The method of claim 15, further comprising forming a gate dielectric layer around the Si nanowires, and forming a gate electrode layer around the gate dielectric layer.

17. The method of claim 15, wherein b) includes forming a patterned film on the SiGe layer; and etching the SiGe layer according to the patterned film.

18. The method of claim 17, wherein c) includes selectively growing the oxide layer as an epitaxial layer on the substrate but not on the patterned film.

19. The method of claim 17, wherein c) includes growing the oxide layer as an epitaxial layer on the substrate and as a non-epitaxial layer on the patterned film; and removing the non-epitaxial layer from the patterned film.

20. The method of claim 15, wherein the oxide layer includes an epitaxial oxide selected from the group consisting of $SiO_2$ and a metal oxide.

* * * * *